(12) United States Patent
Sato

(10) Patent No.: US 8,797,755 B2
(45) Date of Patent: Aug. 5, 2014

(54) WIRING BOARD AND MANUFACTURING METHOD OF WIRING BOARD

(71) Applicant: Sony Corporation, Tokyo (JP)

(72) Inventor: Junichi Sato, Oita (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/958,983

(22) Filed: Aug. 5, 2013

(65) Prior Publication Data

US 2014/0055967 A1    Feb. 27, 2014

(30) Foreign Application Priority Data

Aug. 24, 2012   (JP) ................................. 2012-185688

(51) Int. Cl.
*H05K 1/18*     (2006.01)
*H05K 1/11*     (2006.01)

(52) U.S. Cl.
USPC .......................................... 361/761; 174/262

(58) Field of Classification Search
CPC ................. H01L 2924/00; H01L 2224/16225; H01L 2224/32225; H01L 2224/48227; H01L 2224/73265; H01L 2224/45144; H01L 2224/73204; H01L 2224/32145; H01L 2924/00012; H01L 2924/01078; H01L 2924/01079
USPC ................. 174/250, 262, 255; 257/633, 747; 361/760, 761, 748, 679.01, 600
See application file for complete search history.

(56) References Cited

U.S. PATENT DOCUMENTS

2009/0126981 A1*  5/2009  Horiuchi et al. ............... 174/262
2009/0126982 A1*  5/2009  Nakamura et al. ............ 174/262

FOREIGN PATENT DOCUMENTS

JP    2002-026171    1/2002
JP    2008-124124    5/2008

* cited by examiner

*Primary Examiner* — Jenny L Wagner
*Assistant Examiner* — Ahmad D Barnes
(74) *Attorney, Agent, or Firm* — Rader, Fishman & Grauer PLLC

(57) ABSTRACT

There is provided a wiring board including a first stiffener, one face of which is bonded to a circuit board, a second stiffener having a disposition hole in which an electronic component is disposed, and a laminate that is formed by laminating a plurality of insulating layers and a plurality of wiring layers between the other face of the first stiffener and one face of the second stiffener, and includes a terminal connection part that is connected to the wiring layers, positioned in the disposition hole, and connected to a terminal part of the electronic component.

5 Claims, 10 Drawing Sheets

1··· WIRING BOARD
2··· LAMINATE
3··· FIRST STIFFENER
4··· SECOND STIFFENER
4a··· DISPOSITION HOLE
5··· INSULATING LAYER
6··· WIRING LAYER
7··· TERMINAL CONNECTION PART
8··· THROUGH HOLE
10··· CONNECTION PAD
12··· ELECTRONIC COMPONENT
12a··· TERMINAL PART
100··· CIRCUIT BOARD

1 · · · WIRING BOARD
2 · · · LAMINATE
3 · · · FIRST STIFFENER
4 · · · SECOND STIFFENER
4a · · · DISPOSITION HOLE
5 · · · INSULATING LAYER
6 · · · WIRING LAYER
7 · · · TERMINAL CONNECTION PART
8 · · · THROUGH HOLE
10 · · · CONNECTION PAD
12 · · · ELECTRONIC COMPONENT
12a · · · TERMINAL PART
100 · · · CIRCUIT BOARD

3··· FIRST STIFFENER
7··· TERMINAL CONNECTION PART
8··· THROUGH HOLE
10··· CONNECTION PAD

3 · · · FIRST STIFFENER
7 · · · TERMINAL CONNECTION PART
8 · · · THROUGH HOLE
10 · · · CONNECTION PAD

2 · · · LAMINATE
3 · · · FIRST STIFFENER
5 · · · INSULATING LAYER
6 · · · WIRING LAYER
7 · · · TERMINAL CONNECTION PART
8 · · · THROUGH HOLE
10 · · · CONNECTION PAD

2 ··· LAMINATE
3 ··· FIRST STIFFENER
4 ··· SECOND STIFFENER
4a ··· DISPOSITION HOLE
5 ··· INSULATING LAYER
6 ··· WIRING LAYER
7 ··· TERMINAL CONNECTION PART
8 ··· THROUGH HOLE
10 ··· CONNECTION PAD

2 · · · LAMINATE
3 · · · FIRST STIFFENER
4 · · · SECOND STIFFENER
4a · · · DISPOSITION HOLE
5 · · · INSULATING LAYER
6 · · · WIRING LAYER
7 · · · TERMINAL CONNECTION PART
8 · · · THROUGH HOLE
10 · · · CONNECTION PAD

1 · · · WIRING BOARD
2 · · · LAMINATE
3 · · · FIRST STIFFENER
4 · · · SECOND STIFFENER
4a · · · DISPOSITION HOLE
5 · · · INSULATING LAYER
6 · · · WIRING LAYER
7 · · · TERMINAL CONNECTION PART
8 · · · THROUGH HOLE
10 · · · CONNECTION PAD

WIRING BOARD AND MANUFACTURING METHOD OF WIRING BOARD

BACKGROUND

The present technology relates to the technical field of a wiring board and a manufacturing method of a wiring board. Specifically, the present technology relates to the technical field for improving flip-chip connectability and preventing occurrence of chipping in an IC (Integrated Circuit) chip by forming a laminate that is obtained by laminating a plurality of insulating layers and a plurality of wiring layers between a first stiffener and a second stiffener and thereby suppressing occurrence of warping.

Along with the recent speed-up and high performance of electronic components (IC chips) used as microprocessors, or the like of a computer, the number of terminals tends to increase and pitches between terminals tend to be narrow. Generally, a large number of terminal parts are provided on the bottom of an IC chip in an array form.

Such terminal parts of an IC chip have a large difference in pitch with respect to connection terminals formed on a circuit board that is called a mother board, and thus it is difficult to mount the IC chip on the mother board.

Thus, in order to connect the IC chip to the mother board, a wiring board that is called a semiconductor package is formed, the IC chip is mounted on (connected to) the wiring board, then the wiring board is mounted on (connected to) the mother board, and thereby the IC chip is connected to the mother board via the wiring board.

As such a wiring board described above, for example, there is a so-called coreless type wiring board configured by a laminate that is formed by laminating a plurality of insulating layers and a plurality of wiring layers using a build-up method (for example, refer to Japanese Unexamined Patent Application Publication No. 2002-26171). In such a coreless type wiring board, the length of the entire wiring is shortened by omitting a core board, transmission loss of high frequency signals is reduced, and accordingly, the IC chip can be operated at a high speed.

However, since the coreless type wiring board does not have a core board, the thickness thereof decreases, causing a difficulty in securing high rigidity, and finally, warping easily occurs.

On the other hand, there is a core type wiring board configured in such a way that a plurality of insulating layers and a plurality of wiring layers are laminated on both faces of a core board so as to form a laminate on a wiring board and the core board and the laminates are thereby integrated (for example, refer to Japanese Unexamined Patent Application Publication No. 2008-124124). The core type wiring board has an advantage that general rigidity is higher than that of a coreless type wiring board, and accordingly warping diminishes when a core board is included.

SUMMARY

However, since the laminate is exposed on surfaces in both coreless type and core type wiring boards, cracking or breaking easily occurs particularly in an edge of a board when external force derived from impact, shaking, or the like is exerted thereon, and thus there is concern that chipping may occur.

There is a possibility of a wiring layer being exposed according to the degree of such chipping, and accordingly, a worsening manufacturing yield and low reliability are concerns.

In addition, since such a coreless type wiring board has low rigidity overall as described above, warping easily occurs, and accordingly, a defect in flip-chip connection may be caused.

Particularly, when solder used in bonding is cooled in flip-chip connection of an IC chip, the IC chip is affected by thermal stress resulting from a difference in thermal expansion coefficients between the material of the IC chip and the material of the wiring board, and thereby receives tensile stress on the side of the wiring board. If this stress is strong, a crack occurs in a bonding portion of the IC chip, there is a possibility of an open defect or the like, and thereby a high manufacturing yield and reliability are difficult to realize.

In addition, a wiring board of a type in which a stiffener having high rigidity is bonded to a face of a laminate on the side on which an IC chip is connected so as to increase overall rigidity has been proposed, but in a wiring board of such a type, there is a significant difference between linear expansion coefficients of a laminate and a stiffener, which easily causes warping, and causes great stress after flip-chip connection, and thus there is also a possibility of occurrence of chipping.

Therefore, it is desirable in a wiring board and a manufacturing method of a wiring board of an embodiment of the present technology to overcome the above-described problems, and to prevent occurrence of chipping while suppressing warping.

Firstly, a wiring board includes a first stiffener, one face of which is bonded to a circuit board, a second stiffener having a disposition hole in which an electronic component is disposed, and a laminate that is formed by laminating a plurality of insulating layers and a plurality of wiring layers between the other face of the first stiffener and one face of the second stiffener, and includes a terminal connection part that is connected to the wiring layers, positioned in the disposition hole, and connected to a terminal part of the electronic component.

Thus, the laminate is formed between the first stiffener and the second stiffener in the wiring board.

Secondly; it is preferable that a through hole for connection to the circuit board is formed in the first stiffener.

By forming the through hole for connection to the circuit board in the first stiffener, the wiring board is connected to the circuit board via the through hole.

Firstly, a manufacturing method of a wiring board includes bonding two first stiffeners between which a bonding material is sandwiched, forming laminates by laminating a plurality of insulating layers and a plurality of wiring layers on respective faces of the respective first stiffeners opposite to bonded fixes, the laminates each having a terminal connection part connected to the wiring layers, forming second stiffeners each having a disposition hole in which an electronic component connected to the terminal connection part is disposed on respective faces of the respective laminates opposite to the first stiffeners, and separating the two first stiffeners from each other and removing the bonding material.

Thus, the laminates are respectively positioned between the first stiffeners and the second stiffeners according to the manufacturing method of a wiring board.

Secondly, it is preferable that a through hole for connection to a circuit board is formed in each of the first stiffeners.

By forming the through holes for connection to a circuit board in the first stiffeners, each wiring board is connected to each circuit board.

Thirdly, it is preferable that a thermoplastic film is used as the bonding material.

By using a thermoplastic film as the bonding material, damage and scratches of the first stiffeners are prevented by the film.

According to an embodiment of the present technology, there is provided a wiring board including a first stiffener, one face of which is bonded to a circuit board, a second stiffener having a disposition hole in which an electronic component is disposed, and a laminate that is formed by laminating a plurality of insulating layers and a plurality of wiring layers between the other face of the first stiffener and one face of the second stiffener, and includes a terminal connection part that is connected to the wiring layers, positioned in the disposition hole, and connected to a terminal part of the electronic component.

Thus, since the laminate is positioned between the first stiffener and the second stiffener, overall rigidity is high; a difference in linear expansion coefficients of both sides in the laminating direction decreases, occurrence of warping is accordingly suppressed, and since the laminate is not exposed, occurrence of chipping can be prevented.

According to another embodiment of the present technology, a through hole for connection to the circuit board may be formed in the first stiffener.

Thus, the connection of the laminate and the circuit board can be simply and reliably attained.

According to another embodiment of the present technology, there is provided a manufacturing method of a wiring board including bonding two first stiffeners between which a bonding material is sandwiched, forming laminates by laminating a plurality of insulating layers and a plurality of wiring layers on respective faces of the respective first stiffeners opposite to bonded faces, the laminates each having a terminal connection part connected to the wiring layers, forming second stiffeners each having a disposition hole in which an electronic component connected to the terminal connection part is disposed on respective faces of the respective laminates opposite to the first stiffeners, and separating the two first stiffeners from each other and removing the bonding material.

Thus, since the laminates are respectively positioned between the first stiffeners and the second stiffeners, overall rigidity is high, a difference in linear expansion coefficients of both sides in the laminating direction decreases, occurrence of warping is accordingly suppressed, and since the laminate is not exposed, occurrence of chipping can be prevented.

According to another embodiment of the present technology, a through hole for connection to a circuit board is formed in each of the first stiffeners.

Thus, the connection of each laminate and each circuit board can be simply and reliably attained.

According to another embodiment of the present technology, a thermoplastic film is used as the bonding material.

Thus, a satisfactory bonding property of the two first stiffeners can be secured in addition to preventing damage and scratches of the first stiffeners, and the first stiffeners can be easily bonded to each other using press molding in a heated state.

DETAILED DESCRIPTION OF THE EMBODIMENT(S)

Figure 1:
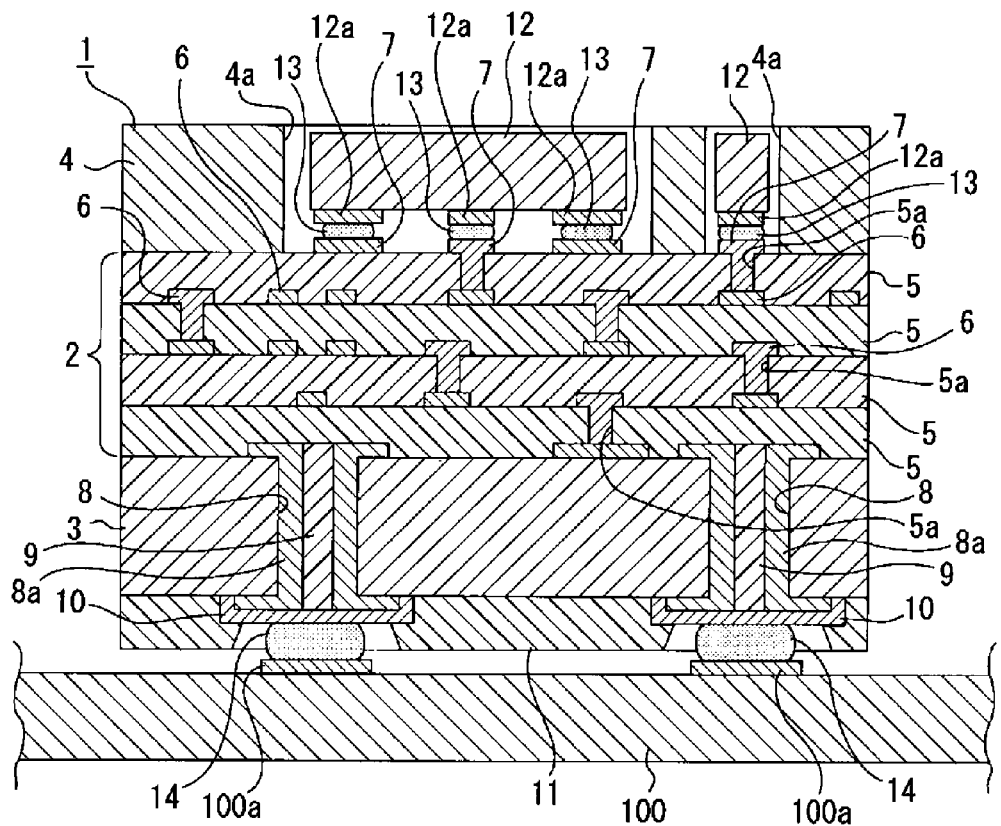
FIG. 1 is an enlarged cross-sectional diagram of a wiring board connected to a mother board, showing a best embodiment of a wiring board and a manufacturing method of a wiring board according to an embodiment of the present technology along with FIGS. 2 to 10.

Hereinafter, preferred embodiments of the present technology will be described in detail with reference to the appended drawings. Note that, in this specification and the appended drawings, structural elements that have substantially the same function and structure are denoted with the same reference numerals, and repeated explanation of these structural elements is omitted.

Hereinafter, preferred embodiments for implementing a wiring board and a manufacturing method of a wiring board of an embodiment of the present technology will be described with reference to the appended drawings.

A wiring board is a wiring board that is a so-called semiconductor package having a structure with a plurality of laminated layers.

In description below, in a wiring board, front to back, top to bottom, and left to right directions are indicated based on a laminating direction of each part which is set to be the top to bottom direction.

It should be noted that the front to back, top to bottom, and left to right directions shown below are for convenience of description, and the present technology is not limited to the directions when the technology is implemented,

[Configuration of Wiring Board]

Hereinbelow, a configuration of a wiring board 1 will be described (with reference to FIG. 1).

The wiring board 1 has a laminate 2, a first stiffener 3 that is positioned on the lower side of the laminate 2, and a second stiffener 4 that is positioned on the upper side of the laminate 2.

The laminate 2 is formed by laminating a plurality of insulating layers 5 and a plurality of wiring layers 6. As a material of the insulating layers 5, for example, an epoxy resin is used, and as a material of the wiring layers 6, for example, copper is used. The wiring layers 6 are connected from an upper layer to a lower layer through predetermined paths.

Terminal connection parts (terminal pads) 7 are formed on the top face of the uppermost insulating layer 5. The terminal connection parts 7 are connected to the wiring layers 6 and connected to terminal parts of an electronic component to be described later.

Via holes 5a are formed in the insulating layers 5, and a conductive material (copper) fills the via holes 5a to be connected to the wiring layers 6. The via holes 5a are formed in the shape of a conic frustum by, for example, radiating a YAG (Yttrium Aluminum Garnet) laser, carbon dioxide laser, or the like to the insulating layers 5.

The first stiffener 3 comes into contact with the lower face of the lowermost insulating layer 5, is formed of a metallic material having high rigidity, for example, copper, or the like, and is thicker than the insulating layer 5. It should be noted that, as a material of the first stiffener 3, for example, a resin material containing glass fiber, carbon fiber, or the like can be used, in addition to a ceramic material.

Through holes 8 for connection to a circuit board (mother board) 10 are formed in the first stiffener 3. In the through holes 8, cylindrical conduction parts 8a are formed of copper. The conduction parts 8a are connected to the wiring layers 6 formed on the lowermost insulating layer 5.

The inside of the conduction parts 8a of the through holes 8 is filled with a filling resin 9.

On the lower face of the first stiffener 3, connection pads 10 are formed. The connection pads 10 are made to be conductive to the conduction parts 8a formed in the through holes 8.

A solder resist 11 is formed on the lower face of the first stiffener 3 so as to cover outer peripheral portions of the connection pads 10.

The second stiffener 4 comes into contact with the top face of the uppermost insulating layer 5, is formed of the same metallic material having high rigidity as the first stiffener 3, for example, copper, and is thicker than the insulating layer 5. It should also be noted that, as a material of the second stiffener 1, for example, a resin material containing glass fiber, carbon fiber, or the like can be used, in addition to a ceramic material.

In the second stiffener 4, disposition holes 4a for disposing electronic components are formed. In the disposition holes 4a, the terminal connection parts 7 which are formed on the uppermost insulating layer 5 are positioned.

In the disposition holes 4a of the second stiffener 4, electronic components 12 are respectively disposed. As the electronic components 12, for example, IC chips, SDRAMs (Synchronous Dynamic Random Access Memories) having a DDR (Double Data Rate) mode, memories, capacitors, and the like are used.

Each electronic component 12 is connected to the laminate 2 through flip-chip connection by bonding terminal parts 12a provided on the lower face of the electronic component to the terminal connection parts 7 via solders 13.

The wiring board 1 on which the electronic components 12 are mounted as described above has the connection pads 10 formed on the first stiffener 3 bonded to connection terminals 100a of the circuit board 100 via solders 14.

The electronic components 12 are electrically connected to each of predetermined circuits formed on the circuit board 100 via the terminal connection parts 7, the wiring layers 6, the conduction parts 8a, and the connection pads 10.

It should be noted that, in the wiring board 1, an underfill material which is not shown in the drawing fills the space between the lower face of the electronic components 12 and the top face of the laminate 2 to cover the connection pads 10 and the terminal connection parts 7. In addition, on the top faces of the electronic components 12, a heat dissipation plate not shown in the drawing is disposed via a heat transfer material layer, for example, a TIM (Thermal Interface Material), or the like, and thereby, heat generated from the electronic components 12 is discharged from the heat dissipation plate.

[Manufacturing Method of Wiring Board]

Next, a manufacturing method of the above-described wiring board 1 will be described (with reference to FIGS. 2 to 9).

Figure 2:
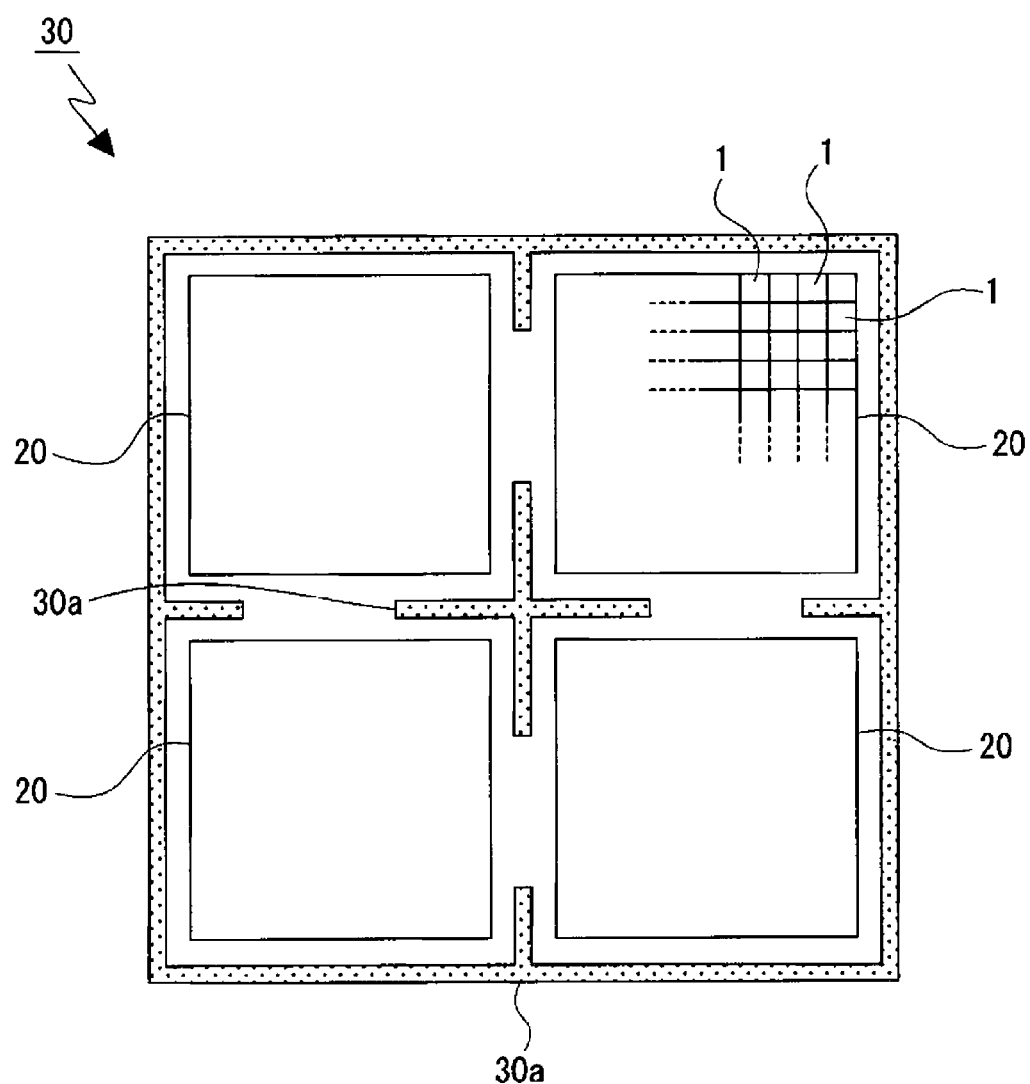
FIG. 2 is a conceptual diagram of a molded body, showing the manufacturing method of a wiring board along with FIGS. 3 to 9.

It should be noted that wiring boards 1 are formed by being cut off and separated from a plurality of product parts 20 through respective routing as shown in FIG. 2. For example, 48 wiring boards 1 are formed from one product part 20, and the plurality of product parts 20 are formed by being cut out from a molded body 30. The molded body 30 has adhesion parts 30a (the portions indicated by flecked regions in the drawing) formed in portions between the outer peripheral portion and the product parts 20.

In this manner, a sufficient space for the adhesion parts 30a can be secured by funning the molded body 30 in a large size to form the wiring boards 1, and accordingly, manufacturing cost of the wiring boards 1 can be lowered.

The wiring boards 1 are formed by being cut off and separated from the product parts 20 cut out from the molded body 30 formed by laminating each part (each layer) as described above, but hereinbelow, description of manufacturing the entire molded body 30 will be omitted, and manufacturing only the portion to be formed as the wiring boards 1 will be described.

Figure 3:
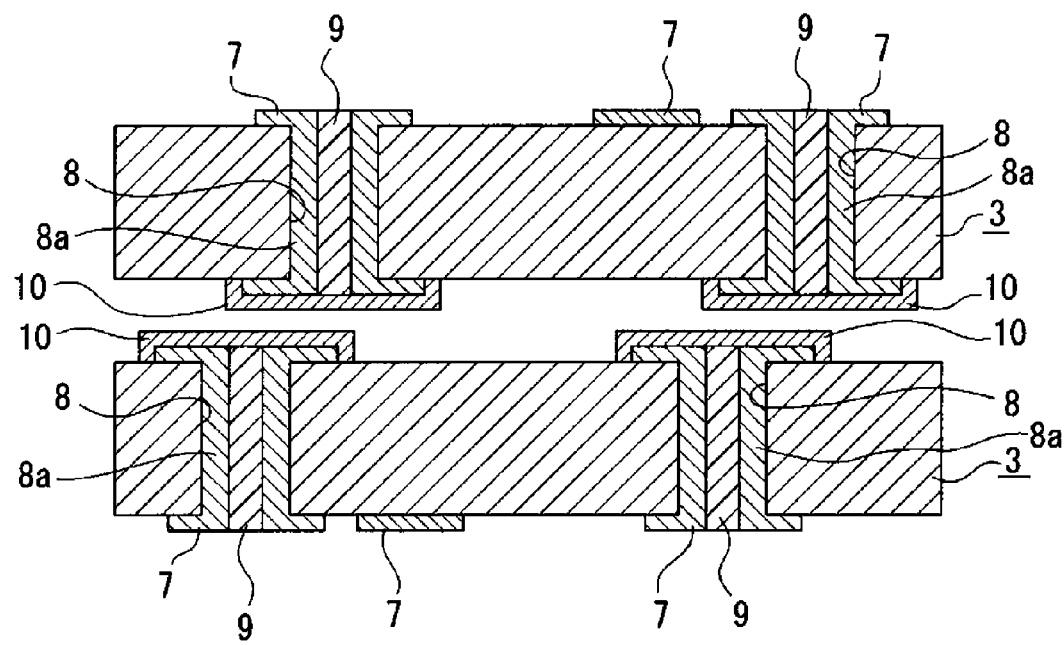
FIG. 3 is an enlarged cross-sectional diagram showing a state in which two first stiffeners are prepared.

First, first stiffeners 3 and 3 are prepared (refer to FIG. 3). Through holes 8 are funned in each first stiffener 3, and conduction parts 8a are formed in the through holes 8. In addition, connection pads 10 are formed on one face of each first stiffener 3.

It should be noted that the through holes 8 are formed in each first stiffener 3 by excavation using, for example, a drill.

The first stiffeners 3 and 3 are disposed such that the surfaces thereof on which the connection pads 10 are formed face each other.

Figure 4:
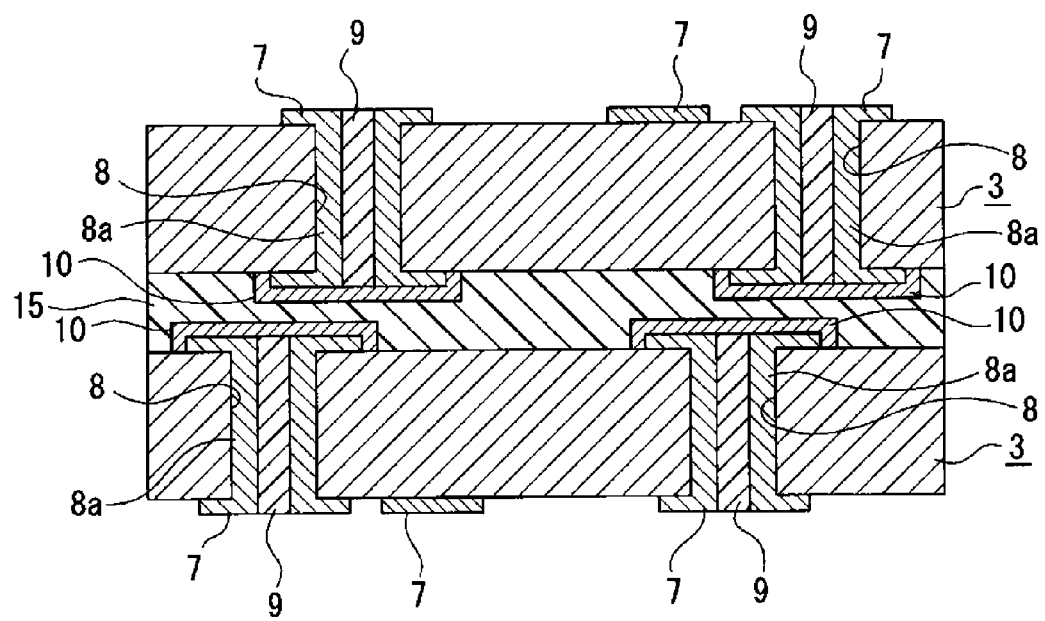
FIG. 4 is an enlarged cross-sectional diagram showing a state in which the two first stiffeners are bonded to each other with a bonding material sandwiched therebetween.

Next, the first stiffeners 3 and 3 are bonded to each other using a bonding material 15 such as a thermoplastic film sandwiched therebetween (stiffener bonding step) (refer to FIG. 4). The bonding of the first stiffeners 3 with the bonding material 15 sandwiched therebetween is performed through press molding (thermocompression bonding).

By using a thermoplastic film as the bonding material 15, damage or scratches of the first stiffeners 3 can be prevented, a satisfactory bonding property of both stiffeners can be secured, and the first stiffeners 3 and 3 can be easily bonded to each other using press molding when they are heated.

Figure 5:
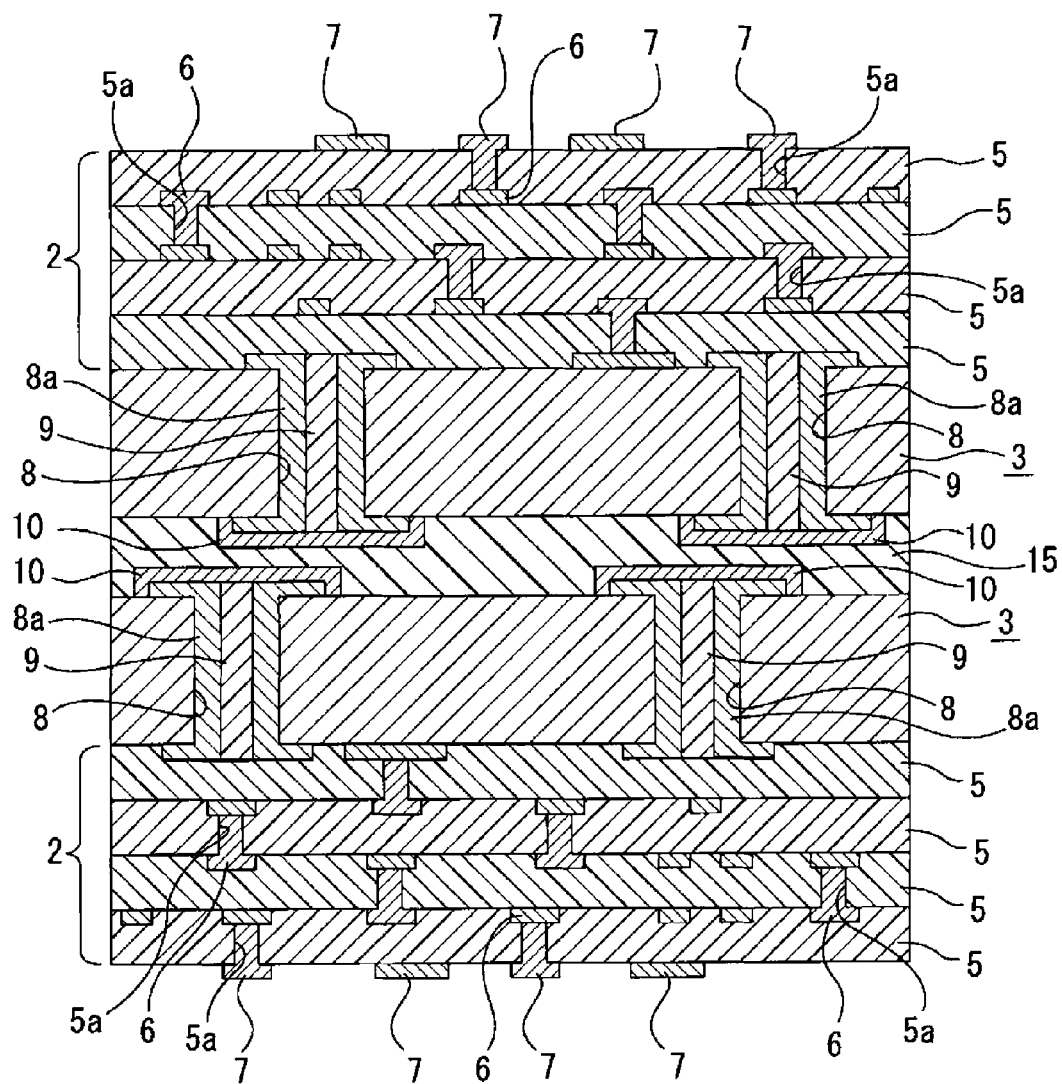
FIG. 5 is an enlarged cross-sectional diagram showing a state in which laminates are formed on the first stiffeners.

Next, laminates 2 are formed by sequentially laminating a plurality of insulating layers 5 and a plurality of wiring layers 6 on the faces opposite to the faces of the first stiffeners 3 and 3 bonded to each other (laminate forming step) (refer to FIG. 5).

Here, there is a possibility of occurrence of warping due to a difference in linear expansion coefficients of the first stiffeners 3 and 3 and the laminates 2 and 2, but warping occurs in the upper laminate 2 and the lower laminate 2 in opposite directions, and thereby the occurrence of warping is suppressed as a whole.

Since the laminates 2 and 2 are formed by laminating each layer on the bonded first stiffeners 3 and 3, rigidity is high when the first stiffeners 3 and 3 are provided, and initial warping at a normal temperature can be suppressed.

Figure 6:
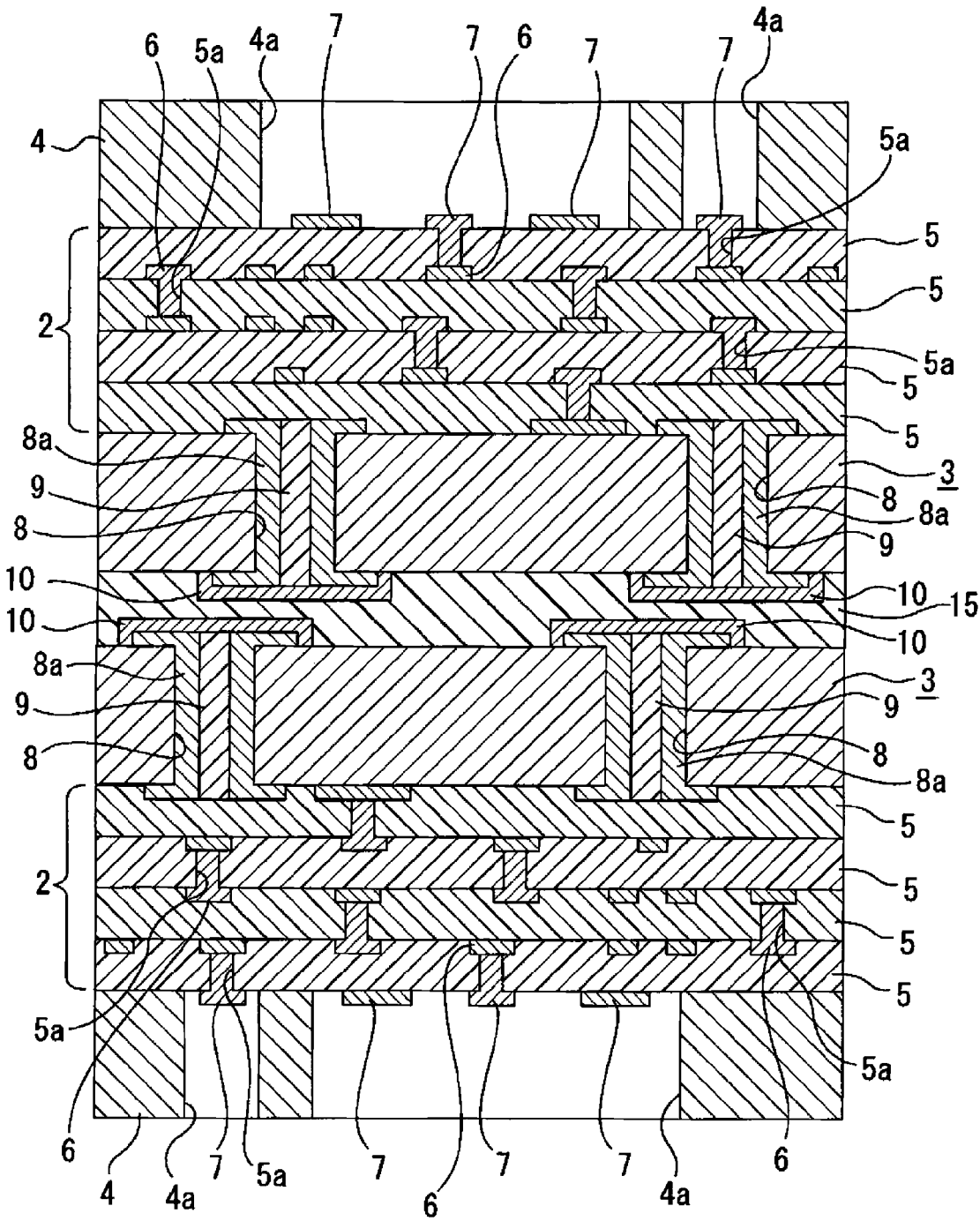
FIG. 6 is an enlarged cross-sectional diagram showing a state in which second stiffeners are formed on the laminates.

Next, second stiffeners 4 and 4 are formed on the faces of the laminates 2 and 2 on which terminal connection parts 7 are formed (stiffener forming step) (refer to FIG. 6). Disposition holes 4a are formed in each second stiffener 4 in advance. The second stiffeners 4 and 4 are formed on the laminates 2 and 2 with the terminal connection parts 7 in the disposition holes 4a.

Figure 7:
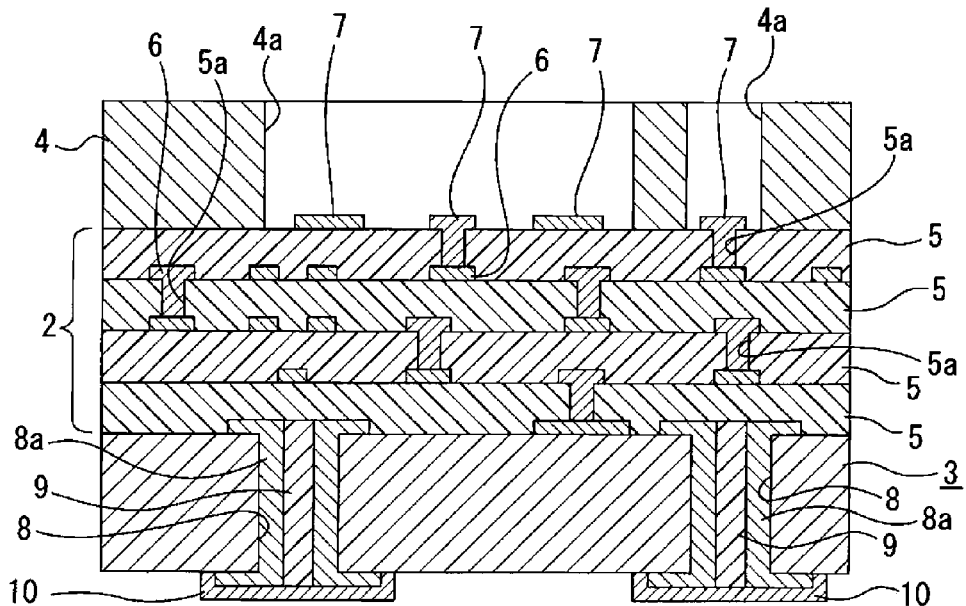
FIG. 7 is an enlarged cross-sectional diagram showing a state in which the first stiffeners are peeled and separated from each other, thereby removing the bonding material.
Figure 7:
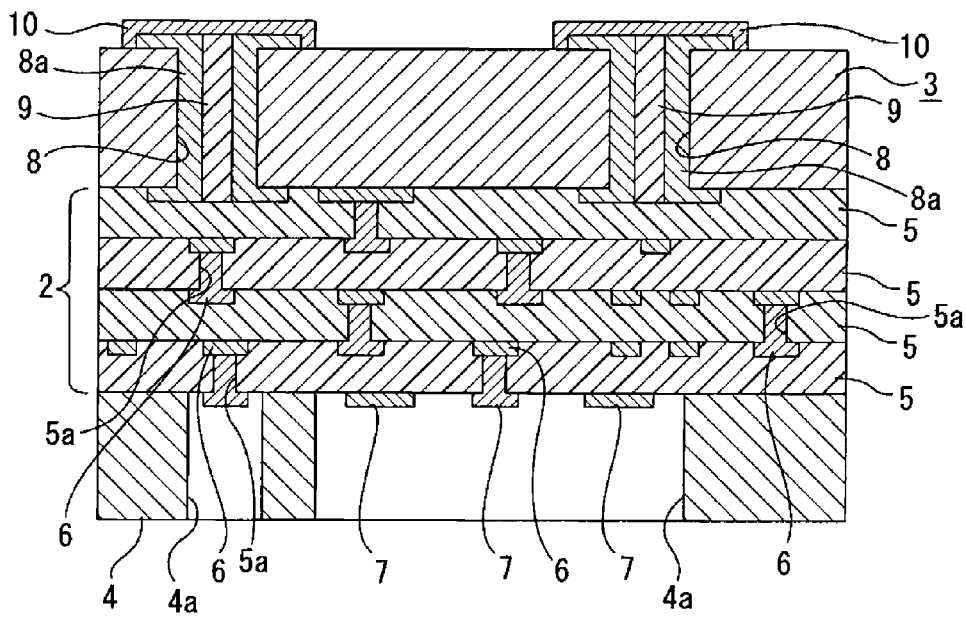

Next, the first stiffeners 3 and 3 are detached and separated from each other, and the bonding material 15 is thereby removed (separation step) (refer to FIG. 7).

Figure 8:
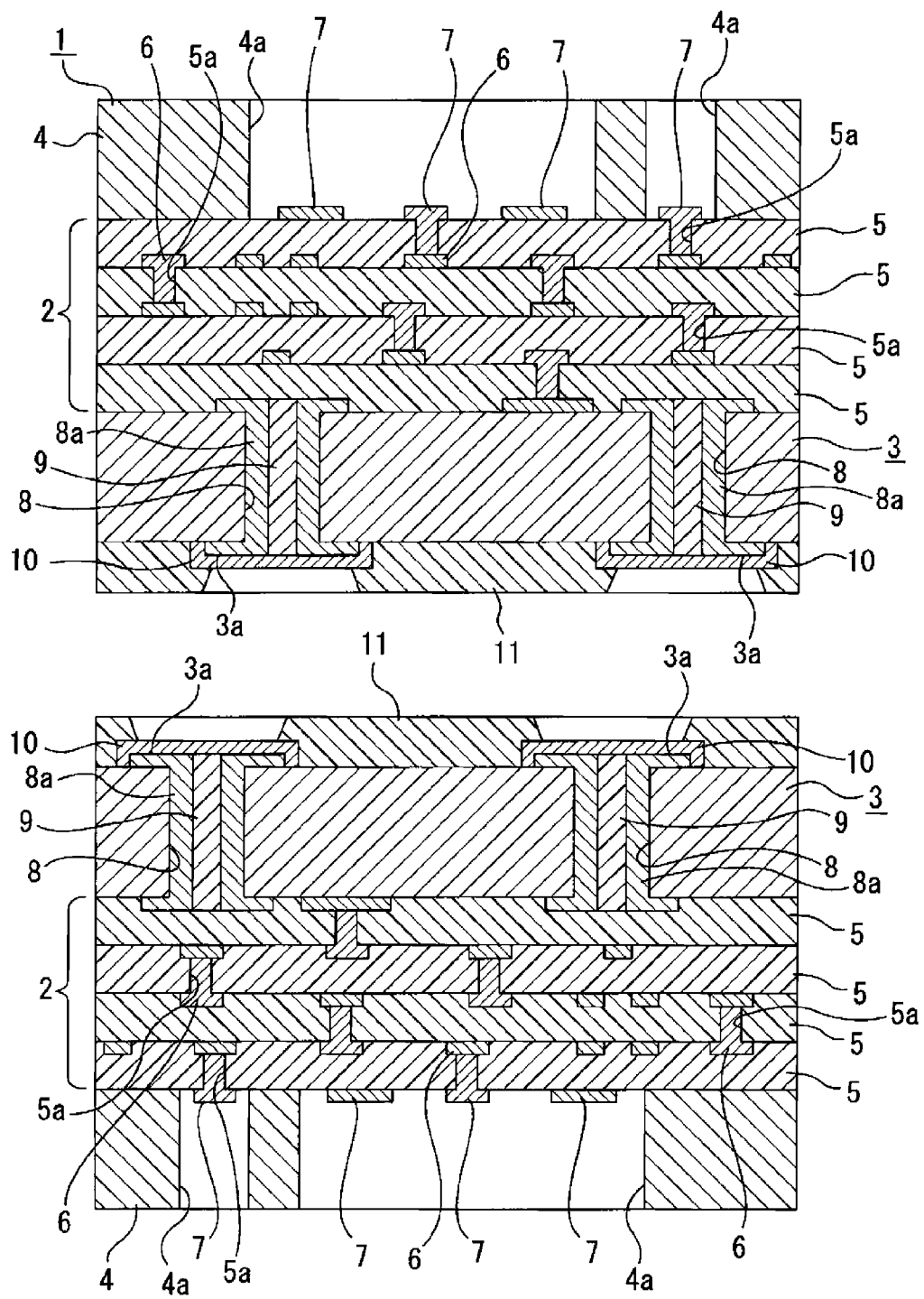
FIG. 8 is an enlarged cross-sectional diagram showing a state in which solder resists are formed in the first stiffeners, and a wiring board is thereby manufactured.

Subsequently, solder resists 11 and 11 are formed in the first stiffeners 3 and 3 so as to cover the outer peripheral portions of the connection pads 10 (refer to FIG. 8). The wiring boards 1 are manufactured by forming the solder resists 11 and 11 on the lower faces of the first stiffeners 3 and 3.

Figure 9:
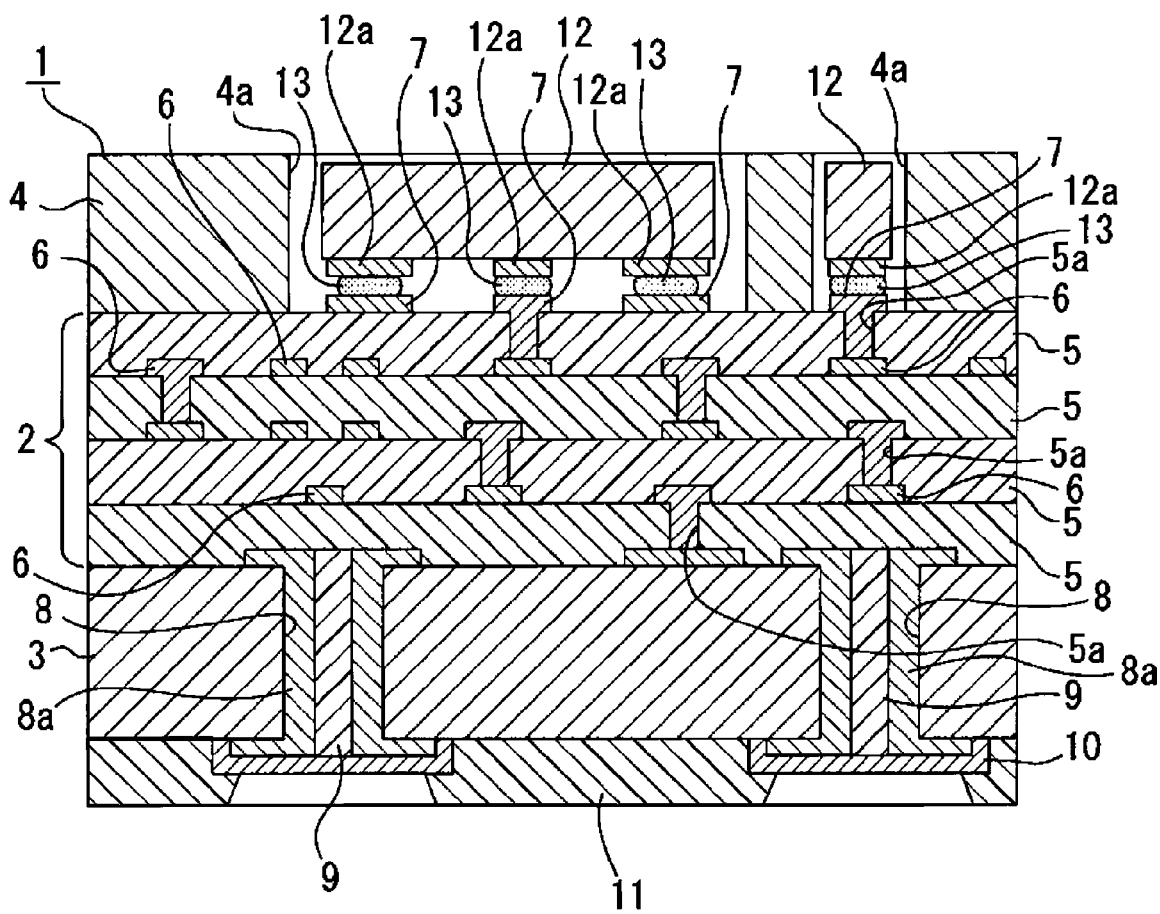
FIG. 9 is an enlarged cross-sectional diagram showing a state in which electronic components are mounted on the wiring board.

Next, electronic components 12 are disposed in the disposition holes 4a of the second stiffeners 4 and 4, and terminal parts 12a are connected to the connection pads 10 via solders 13 (refer to FIG. 9).

The wiring boards 1 and 1 have the connection pads 10 formed on the first stiffeners 3 and 3 bonded to connection terminals 100a of the circuit board 100 via solders 14.

It should be noted that, in each wiring board 1, an underfill material which is not shown in the drawing fills the space between the lower faces of the electronic components 12 and the top face of the laminate 2 to cover the connection pads 10 and the terminal connection parts 7. In addition, seal resins not shown in the drawing fill the disposition holes 4a, and the peripheries of the electronic components 12 are sealed by the seal resins. Furthermore, on the top faces of the electronic components 12, a heat dissipation plate not shown in the drawing is disposed via a heat transfer material layer, for example, a TIM, or the like, and thereby, heat generated from the electronic components 12 is discharged from the heat dissipation plate.

Each wiring board 1 is manufactured using the method in which two first stiffeners 3 and 3 are bonded to each other, and the laminates 2 and 2 are formed on the bonded first stiffeners 3 and 3 as described above. Thus, the occurrence of warping can be suppressed in the manufacturing process, a plurality of wiring boards 1 can be manufactured in one manufacturing process, and manufacturing cost can be accordingly lowered.

[Measurement Result]

Hereinbelow, results obtained by measuring amounts of warping at respective temperatures in the wiring board 1 and a wiring board of the related art will be described (refer to FIG. 10).

The measurement was performed on the wiring board 1 according to an embodiment of the present technology, a wiring board a of the related art in which a stiffener was provided only on a top face of a laminate, and a coreless type wiring board b of the related art that was constituted only by a laminate, and the wiring boards 1, a, and b were heated to a maximum temperature of 250° C.

Figure 10:
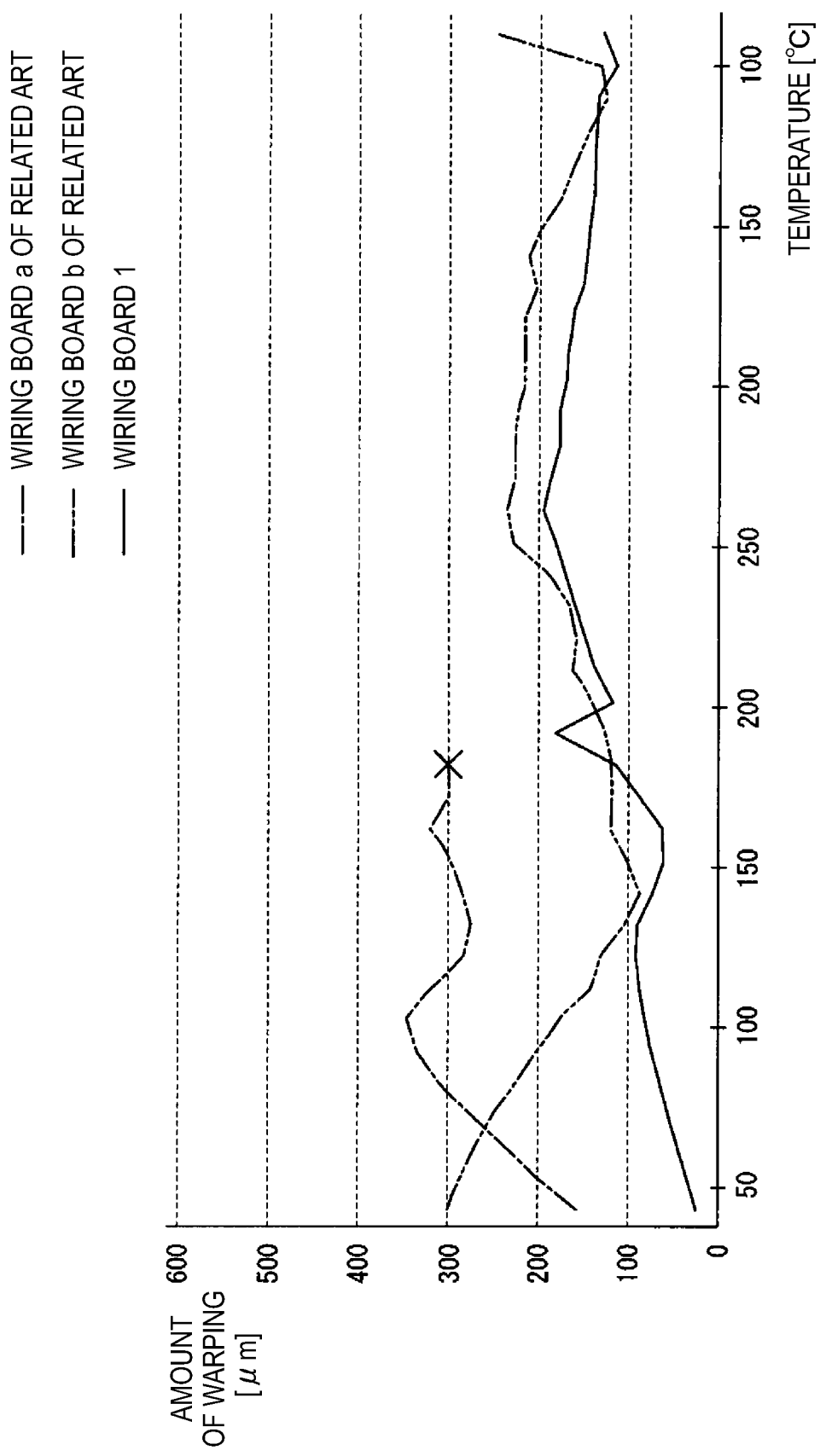
FIG. 10 is a block diagram showing results obtained by measuring amounts of warping in wiring boards according to temperatures.

In FIG. 10, the horizontal axis represents temperature, indicating the course of heating up to the maximum temperature of 250° C., stopping heating, and then cooling, and the vertical axis represents the amount of warping (vertical direction).

As shown in FIG. 10, as the wiring board a was heated to 200° C., breakage occurred due to serious warping (the mark x in FIG. 10).

The wiring board b showed a considerable amount of warping even in a low temperature state, the amount of warping gradually decreased from a low temperature to 150° C., and then the amount of warping gradually increased as the wiring board was heated to 150° C. or higher.

On the other hand, the wiring board 1 had an amount of warping that was less than those of the wiring boards a and b in substantially the entire temperature distribution, had a sufficiently low amount of warping at a low temperature, and even at high temperature had an amount of warping at which a durable product could still be provided.

[Conclusion]

As described above, in the wiring board 1, the laminate 2 is positioned between the first stiffener 3 and the second stiffener 4.

Thus, overall rigidity of the wiring board 1 is high and linear expansion coefficients on both sides thereof in the laminating directions is lowered, which results in suppressed occurrence of warping, and accordingly, improvements in a manufacturing yield and in reliability can be achieved.

Particularly, since the electronic components 12 are mounted in the state in which the laminate 2 is formed between the first stiffener 3 and the second stiffener 4, warping occurring during heating performed when the electronic components 12 are bonded to the laminate 2 through a flip-chip connection can be effectively suppressed.

Since both sides of the laminate 2 are covered by the first stiffener 3 and the second stiffener 4, and the laminate 2 is thereby not exposed, and occurrence of chipping in the laminate 2 can be prevented.

Furthermore, since the through holes 8 are formed in the first stiffener 3 so as to be connected to the circuit board 100, connection of the laminate 2 and the circuit board 100 can be simply and reliably made.

It should be noted that, since fewer connection terminals 100a of the circuit board 100 than the terminal parts (terminal connection parts 7) on the side of each electronic component 12 may be provided, and the size and the number of through holes 8 may be reduced, the through holes 8 can be formed using a drill at a low cost.

In addition, since few through holes 8 may be provided, the wiring board 1 can be miniaturized accordingly.

Furthermore, since the sizes of the through holes 8 are large, the sizes of the conduction parts 8a can accordingly increase, delay of a transmission speed between the electronic components 12 and the circuit board 100 can be avoided, and thereby deterioration of an electric characteristic can be suppressed.

It should be noted that, since a careless board has a high linear expansion coefficient in a direction orthogonal to a laminating direction, cracks that are so-called white bumps occur in internal insulating layers during bonding of electronic components (chip components), but since the wiring board 1 has a low linear expansion coefficient in the direction orthogonal to the laminating direction, occurrence of white bumps can also be reduced.

In addition, a coreless board is formed using a method in which insulating layers and wiring layers are laminated on a support body having high rigidity, and then the supporting body is discarded, but the wiring board 1 keeps the first stiffener 3 and the second stiffener 4 functioning as supporting bodies even after it is manufactured as a product, and thus losses in natural resources and processes caused by such discarding can be reduced.

Furthermore, there are cases in which a wiring board that is vulnerable to warping should be clamped using a dedicated clamper in order to secure flatness in a manufacturing process and a transporting process, but since warping seldom occurs in the wiring board 1, the wiring board may be held using an inexpensive holder (fixture), and accordingly, a reduction in manufacturing cost resulting from a reduction in development cost and manufacturing cost of the holder can be achieved.

[Present Technology]

Additionally, the present technology may also be configured as below.

(1) A wiring board including:
a first stiffener, one face of which is bonded to a circuit board;
a second stiffener having a disposition hole in which an electronic component is disposed; and
a laminate that is formed by laminating a plurality of insulating layers and a plurality of wiring layers between the other face of the first stiffener and one face of the second stiffener, and includes a terminal connection part that is connected to the wiring layers, positioned in the disposition hole, and connected to a terminal part of the electronic component.

(2) The wiring board according to (1), wherein a through hole for connection to the circuit board is formed in the first stiffener.

(3) A manufacturing method of a wiring board, including:
bonding two first stiffeners between which a bonding material is sandwiched;
forming laminates by laminating a plurality of insulating layers and a plurality of wiring layers on respective faces of the respective first stiffeners opposite to bonded faces, the laminates each having a terminal connection part connected to the wiring layers;
forming second stiffeners each having a disposition hole in which an electronic component connected to the terminal connection part is disposed on respective faces of the respective laminates opposite to the first stiffeners; and
separating the two first stiffeners from each other and removing the bonding material.

(4) The manufacturing method of a wiring board according to (3), wherein a through hole for connection to a circuit board is formed in each of the first stiffeners.

(5) The manufacturing method of a wiring board according to (3) or (4), wherein a thermoplastic film is used as the bonding material.

It should be understood by those skilled in the art that various modifications, combinations, sub-combinations and alterations may occur depending on design requirements and other factors insofar as they are within the scope of the appended claims or the equivalents thereof.

The present technology contains subject matter related to that disclosed in Japanese Priority Patent Application JP 2012-185688 filed in the Japan Patent Office on Aug. 24, 2012, the entire content of which is hereby incorporated by reference.

What is claimed is:

1. A wiring board comprising:
a first stiffener, one face of which is bonded to a circuit board;
a second stiffener having a disposition hole in which an electronic component is disposed; and
a laminate that is formed by laminating a plurality of insulating layers and a plurality of wiring layers between the other face of the first stiffener and one face of the second stiffener, and includes a terminal connection part that is connected to the wiring layers, positioned in the disposition hole, and connected to a terminal part of the electronic component.

2. The wiring board according to claim 1, wherein a through hole for connection to the circuit board is formed in the first stiffener.

3. A manufacturing method of a wiring board, comprising:
bonding two first stiffeners between which a bonding material is sandwiched;
forming laminates by laminating a plurality of insulating layers and a plurality of wiring layers on respective faces of the respective first stiffeners opposite to bonded faces, the laminates each having a terminal connection part connected to the wiring layers;
forming second stiffeners each having a disposition hole in which an electronic component connected to the terminal connection part is disposed on respective faces of the respective laminates opposite to the first stiffeners; and
separating the two first stiffeners from each other and removing the bonding material.

4. The manufacturing method of a wiring board according to claim 3, wherein a through hole for connection to a circuit board is formed in each of the first stiffeners.

5. The manufacturing method of a wiring board according to claim 3, wherein a thermoplastic film is used as the bonding material.

* * * * *